United States Patent
Ito

(10) Patent No.: US 10,536,134 B2
(45) Date of Patent: Jan. 14, 2020

(54) ACOUSTIC WAVE DEVICE AND COMMUNICATION APPARATUS

(71) Applicant: KYOCERA Corporation, Kyoto-shi, Kyoto (JP)

(72) Inventor: Motoki Ito, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 154 days.

(21) Appl. No.: 15/572,620

(22) PCT Filed: May 19, 2016

(86) PCT No.: PCT/JP2016/064883
§ 371 (c)(1),
(2) Date: Nov. 8, 2017

(87) PCT Pub. No.: WO2016/190216
PCT Pub. Date: Dec. 1, 2016

(65) Prior Publication Data
US 2018/0159506 A1 Jun. 7, 2018

(30) Foreign Application Priority Data

May 22, 2015 (JP) ................................. 2015-104823

(51) Int. Cl.
*H03H 9/64* (2006.01)
*H03H 9/54* (2006.01)
(Continued)

(52) U.S. Cl.
CPC ............ *H03H 9/6483* (2013.01); *H01Q 1/50* (2013.01); *H03H 9/145* (2013.01); *H03H 9/542* (2013.01); *H04B 1/40* (2013.01)

(58) Field of Classification Search
CPC .......... H03H 9/145; H03H 9/54; H03H 9/542; H03H 9/568; H03H 9/605; H03H 9/6406;
(Continued)

(56) References Cited

U.S. PATENT DOCUMENTS 5,559,481 A    9/1996   Satoh et al.
6,018,281 A *   1/2000   Taguchi ................... H03H 9/64
                                                                               310/313 R
(Continued)

FOREIGN PATENT DOCUMENTS

JP    H5-183380 A    7/1993
JP    H7-154200 A    6/1995
(Continued)

OTHER PUBLICATIONS

An English language machine translation of JP 09-167937, published Jun. 24, 1997, 17 pages. (Year: 1997).*
(Continued)

*Primary Examiner* — Barbara Summons
(74) *Attorney, Agent, or Firm* — Procopio Cory Hargreaves and Savitch LLP

(57) ABSTRACT

An acoustic wave device includes a plurality of serial resonators and a plurality of parallel resonators configured by acoustic wave elements, which plurality of serial resonators and plurality of parallel resonators configure a filter in which they are connected in a ladder configuration; a first capacitance part which is connected in parallel to at least one of the plurality of serial resonators; and a second capacitance part which is connected in series to at least one of the plurality of parallel resonators.

14 Claims, 11 Drawing Sheets

(51) Int. Cl.
*H03H 9/145* (2006.01)
*H01Q 1/50* (2006.01)
*H04B 1/40* (2015.01)

(58) Field of Classification Search
CPC .. H03H 9/6423; H03H 9/6483; H03H 9/6489; H01Q 1/50; H04B 1/40
USPC ................................ 333/133, 189, 193, 195
See application file for complete search history.

(56) References Cited

U.S. PATENT DOCUMENTS

| | | | | |
|---|---|---|---|---|
| 6,593,678 | B1* | 7/2003 | Flowers | H03H 9/0542 |
| | | | | 310/313 R |
| 7,034,638 | B2* | 4/2006 | Yamamoto | H03H 9/6483 |
| | | | | 310/313 R |
| 7,915,975 | B2* | 3/2011 | Bauer | H03H 9/0028 |
| | | | | 333/193 |
| 8,552,820 | B2* | 10/2013 | Hara | H03H 7/38 |
| | | | | 333/133 |
| 9,230,745 | B2* | 1/2016 | Kadota | H01G 7/06 |
| 2010/0127799 | A1* | 5/2010 | Bauer | H03H 9/0542 |
| | | | | 333/195 |
| 2013/0109332 | A1* | 5/2013 | Aigner | H03H 9/02102 |
| | | | | 455/90.2 |
| 2014/0354512 | A1 | 12/2014 | Kadota | |
| 2015/0349748 | A1* | 12/2015 | Bauer | H03H 9/542 |
| | | | | 333/133 |

FOREIGN PATENT DOCUMENTS

| | | | |
|---|---|---|---|
| JP | H7-273597 A | | 10/1995 |
| JP | (4)08-018392 A | * | 1/1996 |
| JP | (4)08-065085 A | * | 3/1996 |
| JP | 08-065089 A | * | 3/1996 |
| JP | H9-167937 A | | 6/1997 |
| WO | 2013/125360 A1 | | 8/2013 |
| WO | 2014/034492 A1 | | 3/2014 |

OTHER PUBLICATIONS

An English language translation of the "Notice of Reasons for Refusal" in related JP Patent Application No. 2017-520665 drafted on Jan. 16, 2019, 5 pages. (Year: 2019).*
International Search Report dated Aug. 9, 2016, issued by Japan Patent Office for International Application No. PCT/JP2016/064883.

* cited by examiner

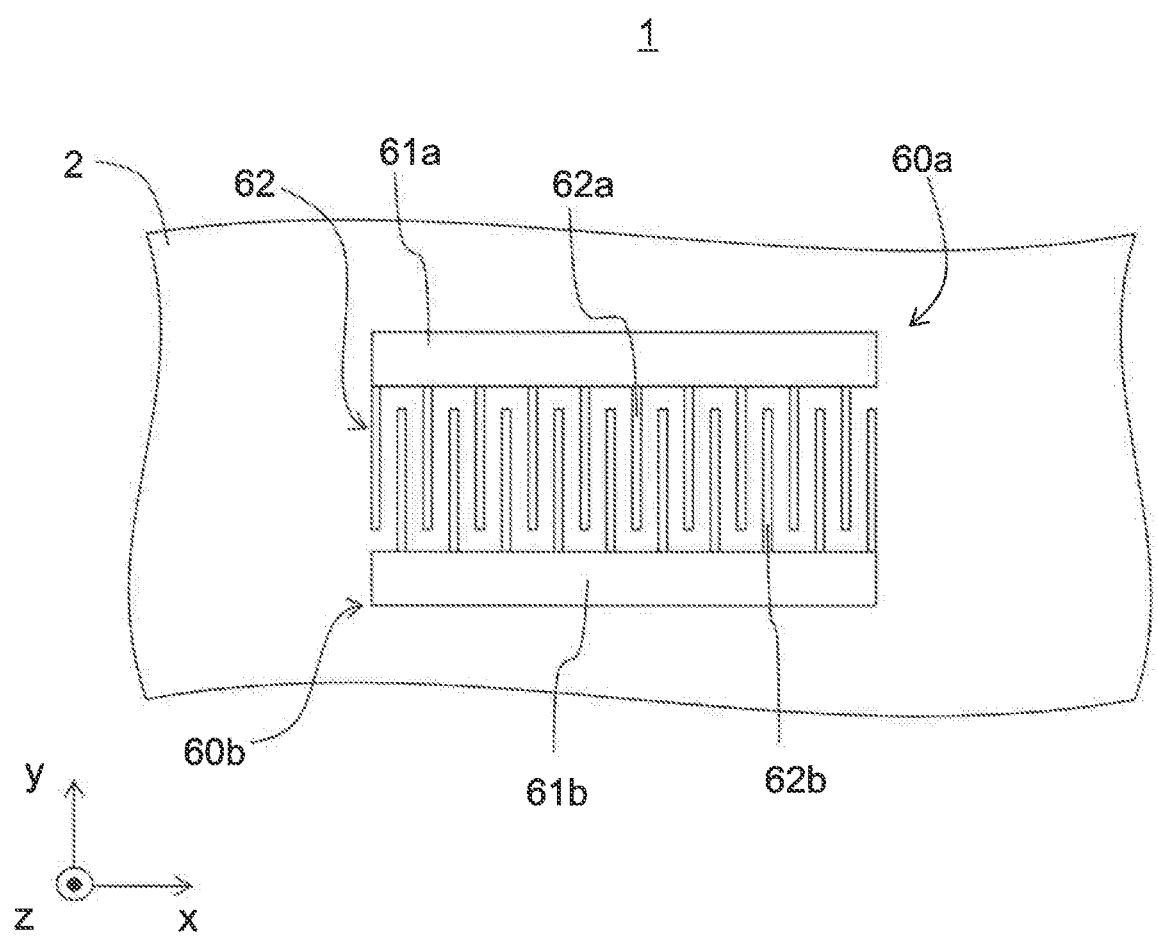

ACOUSTIC WAVE DEVICE AND COMMUNICATION APPARATUS

TECHNICAL FIELD

The present invention relates to an acoustic wave device and communication apparatus.

BACKGROUND ART

In recent years, in mobile terminals and other communication apparatuses, use is made of an acoustic wave element for an acoustic wave device filtering signals transferred via an antenna. An acoustic wave element is configured by a piezoelectric substrate and an excitation electrode which is formed on a major surface of the piezoelectric substrate. The acoustic wave element utilizes the characteristic that an electrical signal and a surface acoustic wave can be converted to each other by the relationship between the excitation electrode and the piezoelectric substrate.

Japanese Patent Publication No. 5-183380A discloses an acoustic wave device configured by connecting a plurality of acoustic wave elements in a ladder configuration.

SUMMARY OF INVENTION

An acoustic wave device according to an embodiment of the present disclosure includes a plurality of serial resonators and a plurality of parallel resonators which are configured by acoustic wave elements, a first capacitance part, and a second capacitance part. The plurality of serial resonators and the plurality of parallel resonators are connected in ladder configuration and configure a filter. Further, provision is made of a first capacitance part which is connected in parallel to at least one of the plurality of serial resonators. Further, provision is made of a second capacitance part which is connected in series to at least one of the plurality of parallel resonators.

A communication apparatus according to an embodiment of the present invention includes an antenna, the acoustic wave device explained above which is electrically connected to the antenna, and an RF-IC which is electrically connected to the acoustic wave device.

BRIEF DESCRIPTION OF DRAWINGS

FIG. 5 A plan view of a first capacitance part C1.

DESCRIPTION OF EMBODIMENTS

Below, an acoustic wave device and a communication apparatus according to an embodiment of the present disclosure will be explained with reference to the drawings. In the acoustic wave device, any direction may be defined as the "upper part" or "lower part". However, in the following description, for convenience, an orthogonal coordinate system xyz will be defined, and use will be made of "upper surface", "lower surface", and other terms by defining the positive side of the z-direction as the "upper part". Note that, the orthogonal coordinate system xyz is defined based on the shape of the acoustic wave device and does not designate the crystal axes of the piezoelectric substrate.

<Acoustic Wave Device>

An acoustic wave device 1 configuring a ladder-type filter will be explained. By using the acoustic wave device 1, attenuation can be made larger outside a passing frequency band of transmission signals.

Figure 1:
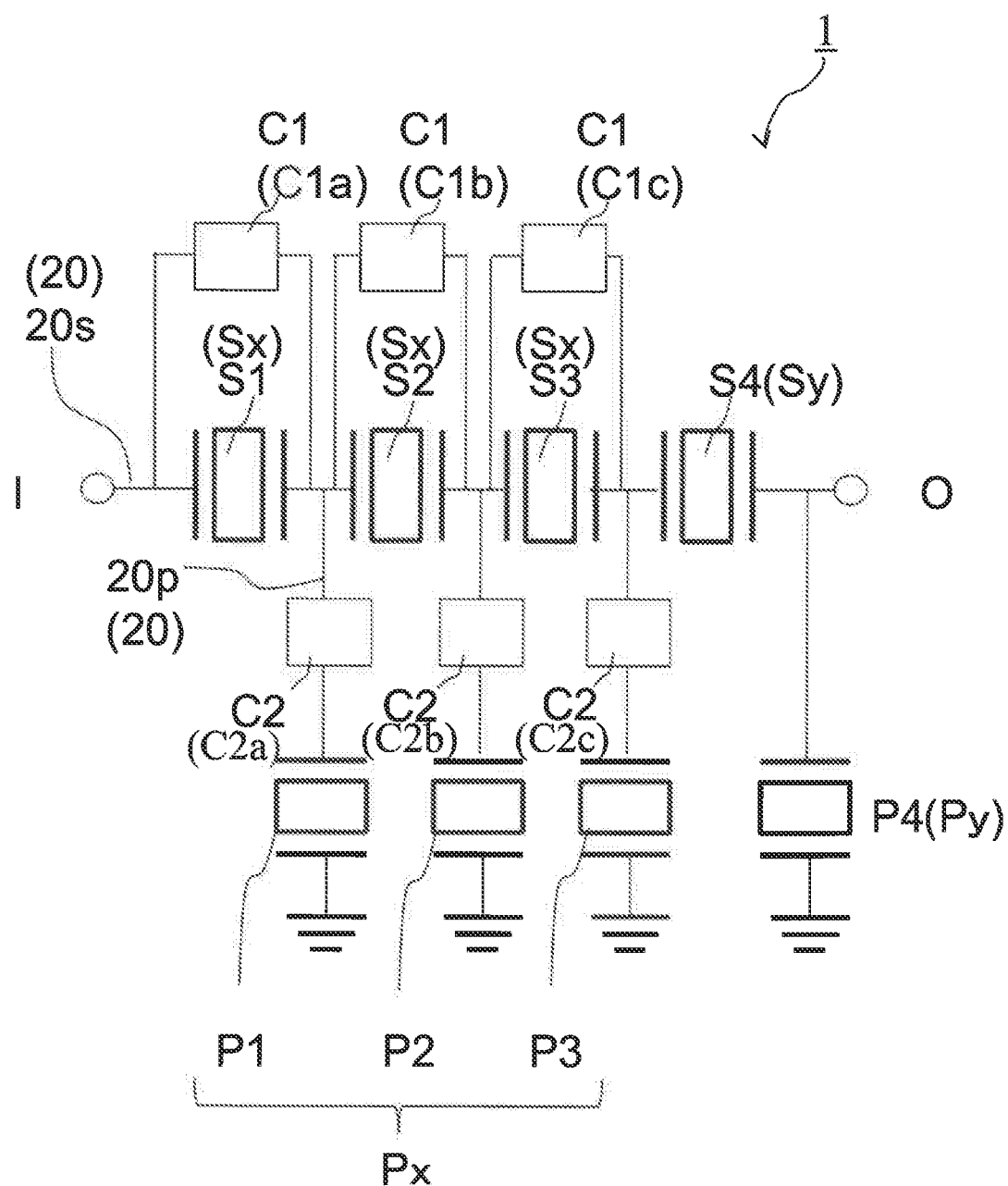
FIG. 1 A circuit diagram of an acoustic wave device according to an embodiment of the present disclosure.

FIG. 1 is a circuit diagram showing the configuration of the acoustic wave device 1 according to an embodiment of the present invention. As shown in FIG. 1, the acoustic wave device 1 is provided with a piezoelectric substrate 2 (not shown), a plurality of serial resonators S1 to S4, and a plurality of parallel resonators P1 to P4. The serial resonators S1 to S4 and parallel resonators P1 to P4 are connected in a ladder configuration between an input part I and an output part O by lines 20. Specifically, the lines 20 include a serial arm 20s which connects the serial resonators S1 to S4 in series and parallel arms 20p which connect the parallel resonators P1 to P4 between the serial arm 20s and the reference potential Gnd. By connecting the plurality of serial resonators S1 to S4 and plurality of parallel resonators P1 to P4 in this way, the ladder type filter is configured.

Further, the acoustic wave device 1 is provided with a first capacitance part C1 which is connected in parallel to at least one of the serial resonators S1 to S4 and a second capacitance part C2 which is connected in series to at least one of the parallel resonators P1 to P4. The capacitance parts C1 may be connected to all serial resonators and the second capacitance parts C2 may be connected to all parallel resonators. In this example, however, first capacitance parts C1 (C1a to C1c) are individually connected in parallel to the serial resonators S1 to S3, and second capacitance parts C2 (C2a to C2c) are individually connected in series to the parallel resonators P1 to P3.

Each of the serial resonators S1 to S4 and parallel resonators P1 to P4 is configured by an acoustic wave (SAW: Surface Acoustic Wave) element.

Figure 2:
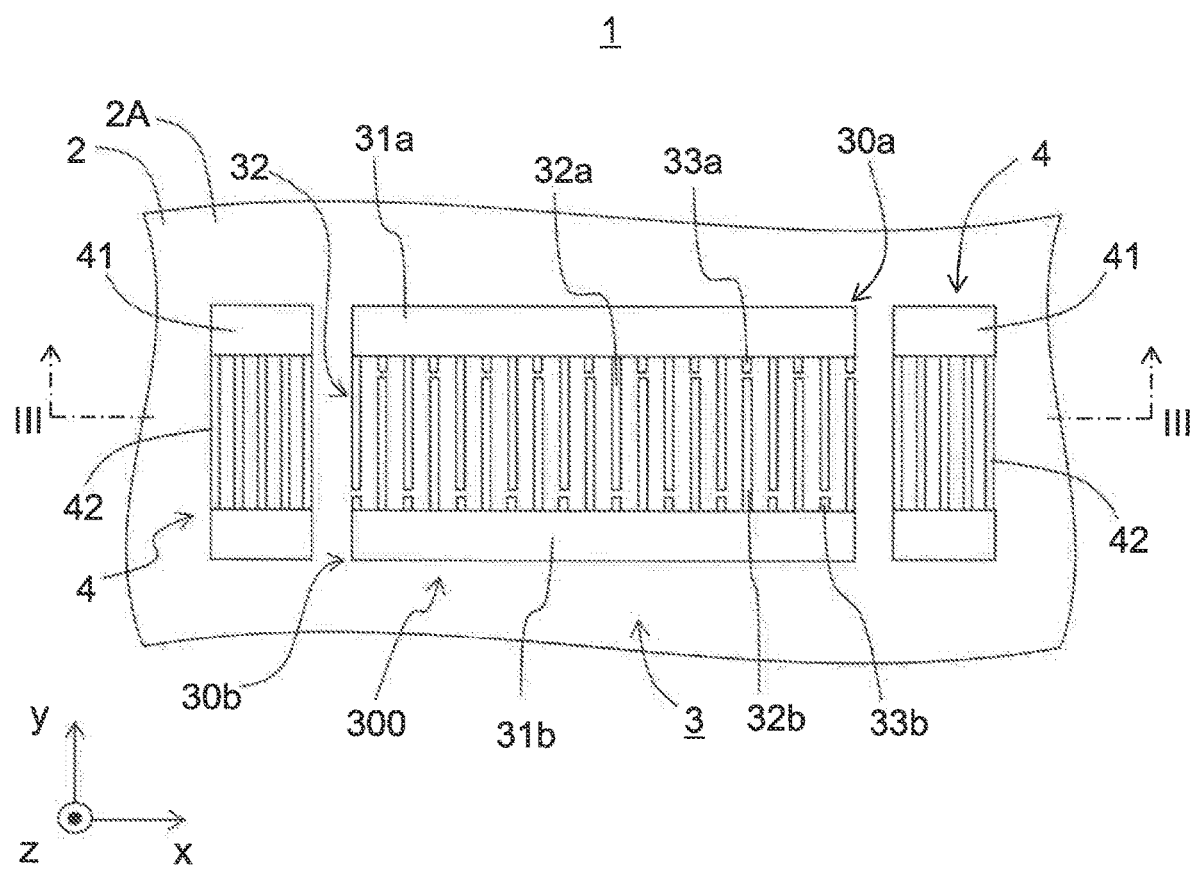
FIG. 2 A plan view of an acoustic wave element configuring the acoustic wave device.
Figure 3:
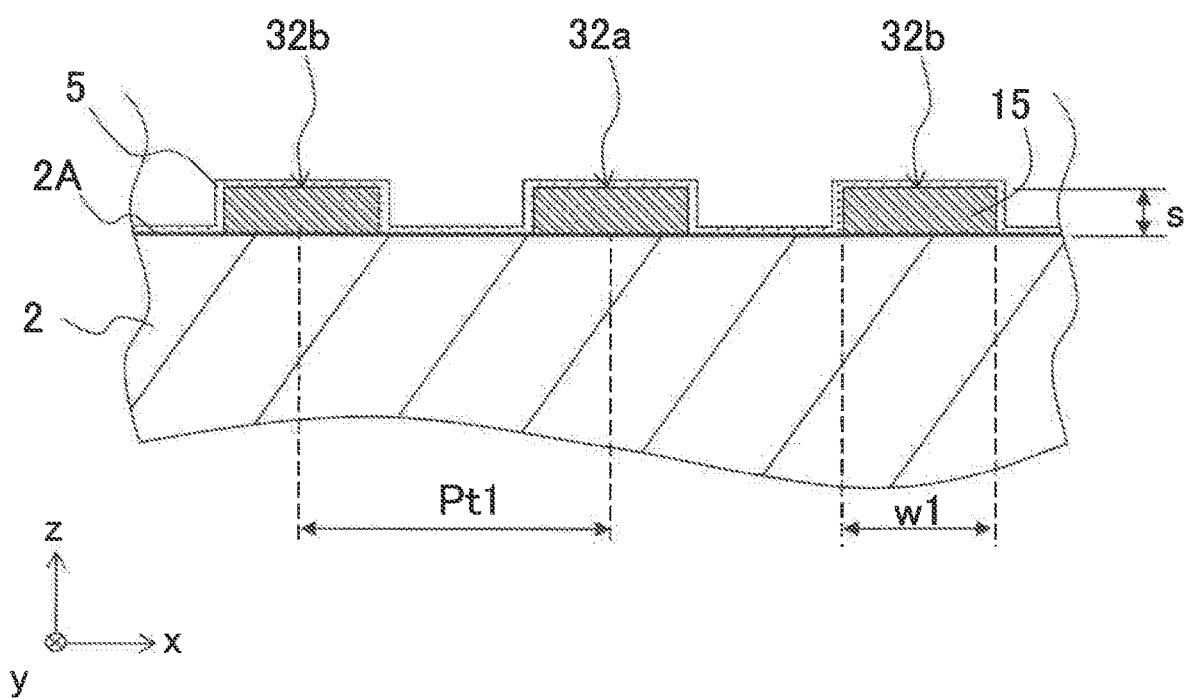
FIG. 3 An enlarged view of a principal part of a cross-section cut along the line in the acoustic wave element in FIG. 2.

FIG. 2 is for example a schematic plan view of the SAW element configuring the serial resonator S1, and FIG. 3 is an enlarged cross-sectional view of a principal part taken along the line III-III in FIG. 2. The SAW element, as shown in FIG.

2, has an IDT (interdigital transducer) electrode 3 and reflectors 4 which are provided on an upper surface 2A of the piezoelectric substrate 2.

The piezoelectric substrate 2 is configured by a substrate of a single crystal having piezoelectricity such as lithium niobate (LN: LiNbO$_3$) crystal or lithium tantalate (LT: LiTaO$_3$) crystal. Specifically, for example, the piezoelectric substrate 2 is configured by a 36° to 48° Y-X cut LiTaO$_3$ substrate. The planar shape and various dimensions of the piezoelectric substrate 2 may be suitably set. As an example, the thickness (z-direction) of the piezoelectric substrate 2 is 0.2 mm to 0.5 mm.

The IDT electrode 3, as shown in FIG. 2, has a first comb-shaped electrode 30a and second comb-shaped electrode 30b. Note that, in the following explanation, sometimes the first comb-shaped electrode 30a and second comb-shaped electrode 30b will be simply referred to as the "comb-shaped electrodes 30" and will not be differentiated.

The comb-shaped electrodes 30, as shown in FIG. 2, have two bus bars 31 (first bus bar 31a and second bus bar 31b) which face each other and a plurality of electrode fingers 32 which extend from one bus bar 31 to the other bus bar 31 side. The electrode fingers 32 include first electrode fingers 32a which are electrically connected to the first bus bar 31a and second electrode fingers 32b which are electrically connected to the second bus bar 31b. Further, in the pair of comb-shaped electrodes 30, the first electrode fingers 32a and the second electrode fingers 32b are arranged so as to intermesh (cross) with each other in the direction of propagation of the acoustic wave.

Note that, in the same way as the comb-shaped electrodes 30, for the bus bars 31 and electrode fingers 32 as well, when the first bus bar 31a and the second bus bar 31b are not differentiated or when the first electrode finger 32a and the second electrode finger 32b are not differentiated, sometimes the terms "first", "second", "a", and "b" will be omitted.

Further, each comb-shaped electrode 30 has dummy electrode fingers 33 which individually face electrode fingers 32 on the other side. First dummy electrode fingers 33a extend from the first bus bar 31a toward the second electrode fingers 32b. Second dummy electrode fingers 33b extend from the second bus bar 31b toward the first electrode fingers 32a. Note that, the dummy electrode fingers 33 also need not be arranged.

The bus bars 31 are substantially for example formed in long shapes so as to linearly extend with the same widths. Accordingly, the edge parts in the bus bars 31 on the sides where they face each other form linear shapes. The plurality of electrode fingers 32 are substantially for example formed in long shapes so as to linearly extend with constant widths and are arranged at substantially constant intervals in the direction of propagation of the acoustic wave.

The plurality of electrode fingers 32 of the pair of comb-shaped electrodes 30 configuring the IDT electrode 3 are set so as to have a pitch Pt1 as shown in FIG. 3. The pitch Pt1 is for example provided so as to become equal to the half-wavelength of the wavelength λ of the acoustic wave at the frequency at which resonation is desired to be caused. The wavelength λ (that is 2×Pt1) is for example 1.5 μm to 6 μm. By arranging the IDT electrode 3 so that most of the plurality of electrode fingers 32 have the pitch Pt1, the plurality of electrode fingers 32 are arranged with a constant period and therefore the acoustic wave can be efficiently generated.

Here, the pitch Pt1 designates the interval in the direction of propagation from the center of a first electrode finger 32a to the center of a second electrode finger 32b which is adjacent to this first electrode finger 32a. In each electrode finger 32, the width w1 in the direction of propagation of the acoustic wave is suitably set in accordance with the electrical characteristics etc. which are demanded from the SAW element. The width w1 of the electrode finger 32 is for example 0.3 time to 0.7 time the pitch Pt1.

By arranging the electrode fingers 32 in this way, an acoustic wave propagating in the direction perpendicular to the plurality of electrode fingers 32 is generated. Accordingly, after considering the crystal orientation of the piezoelectric substrate 2, the two bus bars 31 are arranged so as to face each other in a direction crossing the direction in which the acoustic wave is desired to be propagated. The plurality of electrode fingers 32 are formed so as to extend in a direction perpendicular to the direction in which the acoustic wave is desired to be propagated. Note that, the direction of propagation of the acoustic wave is defined according to the orientation etc. of the plurality of electrode fingers 32. In the present embodiment, however, for convenience, the orientation etc. of the plurality of electrode fingers 32 will be sometimes explained by using the direction of propagation of the acoustic wave as a reference.

The number of the electrode fingers 32 (first electrode fingers 32a and second electrode fingers 32b) is 20 to 350 per side.

The lengths of the pluralities of electrode fingers 32 (lengths from the bus bars to the tip ends) are for example set to be substantially the same. The lengths of intermeshing of the electrode fingers 32 which face each other (crossing width) are 10 to 300 μm. Note that the lengths and crossing widths of the electrode fingers 32 may be changed as well. For example, they may be made longer or shorter the more in the direction of propagation as well. Specifically, by changing the lengths of the electrode fingers 32 relative to the direction of propagation, an apodized IDT electrode 3 may be configured as well. In this case, spurious emission in the transverse mode can be reduced and electric power resistance can be improved.

The IDT electrode 3 is for example formed by a conductive layer 15 of metal. As this metal, for example there can be mentioned Al or an alloy containing Al as a principal ingredient (Al alloy). The Al alloy is for example an Al—Cu alloy. Note that, the IDT electrode 3 may be configured by a plurality of metal layers as well. Various dimensions of the IDT electrode 3 are suitably set in accordance with the electrical characteristics etc. which are demanded from the SAW element. The thickness "s" (z-direction) of the IDT electrode 3 is for example 50 nm to 600 nm.

The IDT electrode 3 may be directly arranged on the upper surface 2A of the piezoelectric substrate 2 or may be arranged on the upper surface 2A of the piezoelectric substrate 2 through an underlying layer configured by another member. Another member is for example made of Ti, Cr, or an alloy of them etc. When the IDT electrode 3 is arranged on the upper surface 2A of the piezoelectric substrate 2 through an underlying layer, the thickness of the other member is set to an extent where it exerts almost no influence upon the electrical characteristics of the IDT electrode 3 (for example a thickness of 1 to 10% of the thickness of the IDT electrode in the case of Ti).

Further, in order to improve the temperature characteristic of the SAW element, a mass-addition film may be laid on the electrode fingers 32 configuring the IDT electrode 3. As the mass-addition film, for example use may be made of SiO$_2$ etc.

In the IDT electrode 3, when a voltage is applied, the acoustic wave propagating in the x-direction is excited in the vicinity of the upper surface 2A of the piezoelectric substrate 2. The excited acoustic wave is reflected at boundaries with areas where no electrode fingers 32 are arranged (long regions between adjacent electrode fingers 32). Further, a standing wave having the pitch Pt1 of the electrode fingers 32 as a half-wavelength is formed. The standing wave is converted to an electrical signal having the same frequency as that of the standing wave and is extracted by the electrode fingers 32. In this way, the SAW element functions as a 1-port resonator.

The reflectors 4 are arranged so as to sandwich the IDT electrode 3 in the direction of propagation of the acoustic wave. The reflectors 4 are formed in substantially slit shapes. That is, the reflectors 4 have reflector bus bars 41 which face each other in a direction crossing the direction of propagation of the acoustic wave and pluralities of reflection electrode fingers 42 which extend in the direction perpendicular to the direction of propagation of the acoustic wave between these bus bars 41. The reflector bus bars 41 are substantially for example formed in long shapes so as to linearly extend with the same widths and are arranged parallel to the direction of propagation of the acoustic wave.

The pluralities of reflection electrode fingers 42 are arranged at a pitch Pt2 reflecting the acoustic wave excited in the IDT electrode 3. The pitch Pt2 may be set to the same extent as the pitch Pt1 when the pitch Pt1 of the IDT electrode 3 is set to the half-wavelength of the wavelength $\lambda$ of the acoustic wave. The wavelength $\lambda$ (that is 2×Pt2) is for example 1.5 μm to 6 μm. Here, the pitch Pt2 designates the interval from the center of one reflection electrode finger 42 to the center of an adjacent reflection electrode finger 42 in the direction of propagation.

Further, the pluralities of reflection electrode fingers 42 are substantially formed in long shapes so as to linearly extend with constant widths. The width w2 of a reflection electrode finger 42 can be set to for example be substantially equal to the width w1 of an electrode finger 32. The reflectors 4 are for example formed by the same material as that for the IDT electrode 3 and are formed to thicknesses equal to the IDT electrode 3.

The reflectors 4 are arranged so as to be separated from the IDT electrode 3 by gaps G. Here, a gap G designates the interval from the center of an electrode finger 32 in the IDT electrode 3 which is positioned at the end part on the reflector 4 side to the center of a reflection electrode finger 42 in the reflector 4 which is positioned at the end part on the IDT electrode 32 side. The gap G is usually set so as to become the same as the pitch Pt1 (or Pt2) of the electrode fingers 32 in the IDT electrode 3.

A protective layer 5, as shown in FIG. 3, is provided on the piezoelectric substrate 2 so as to cover the tops of the IDT electrode 3 and the reflectors 4. Specifically, the protective layer 5 covers the surfaces of the IDT electrode 3 and the reflectors 4 and covers portions in the upper surface 2A of the piezoelectric substrate 2 which are exposed from the IDT electrode 3 and reflectors 4. The thickness of the protective layer 5 is for example 1 nm to 800 nm.

The protective layer 5 is made of a material having an insulation property and contributes to protection from corrosion and so on. Preferably, the protective layer 5 is formed by $SiO_2$ or another material by which the speed of propagation of the acoustic wave becomes faster when the temperature rises. Due to this, the change of electrical characteristics due to the change of temperature of the SAW element can be kept small as well.

The example shown in FIG. 2 and FIG. 3 was explained by taking the serial resonator S1 as an example. The same configuration can be given to the other serial resonators S2 to S4 and parallel resonators P1 to P4 after suitably adjusting the number of electrode fingers 32, pitch, and other parts of the design.

Such serial resonators S1 to S4, in this example, are divided into first serial resonators Sx to which the first capacitance parts C1 are connected in parallel and a second serial resonator Sy to which the parts C1 are not connected. In the same way, the parallel resonators P1 to P4, in this example, are divided into first parallel resonators Px to which the second capacitance parts C2 are connected in series and a second parallel resonator Py to which the parts C2 are not connected. The first capacitance parts C1 and second capacitance parts C2 are not particularly limited in their shapes so far as they can form desired capacitances.

Figure 4A:
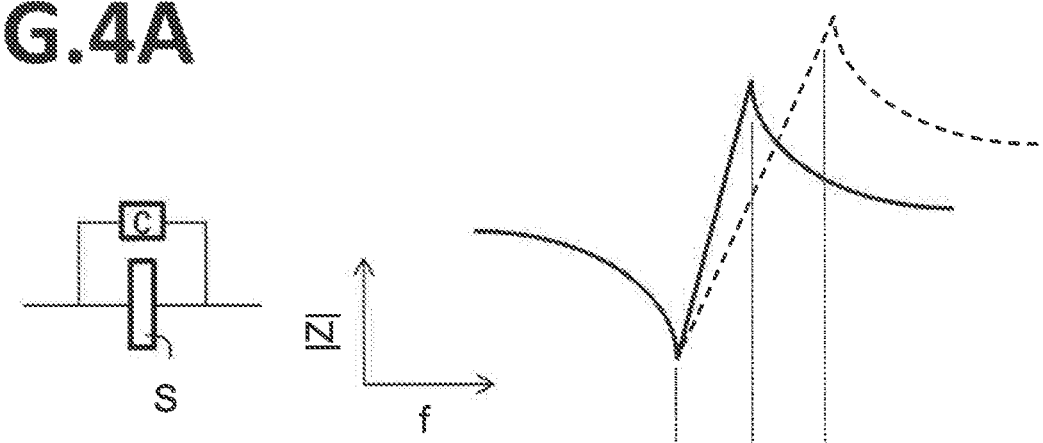
FIG. 4A is an explanatory view for verifying the effect of the acoustic wave device in the present disclosure.

The effect by provision of such first capacitance parts C1 and second capacitance parts C2 will be explained by using FIGS. 4A to 4C. First, FIG. 4A shows the impedance characteristic when capacitances are added in parallel to the serial resonators by a solid line and shows the resonator characteristic when capacitances are not added by a broken line. As clear also from FIG. 4A, it can be confirmed that the anti-resonance frequency shifts to a low frequency side, but the resonance frequency and resistance at the resonance frequency (resonance resistance Z0) do not change. Note that, the amount of shift of the anti-resonance frequency is determined by the magnitude of the capacitance.

Figure 4B:
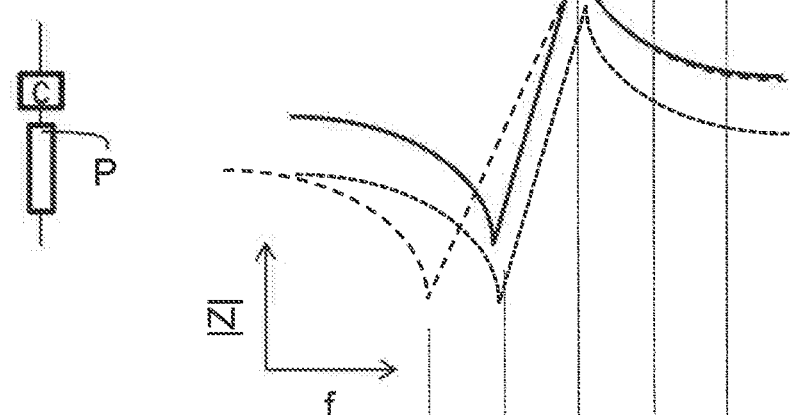
FIG. 4B is an explanatory view for verifying the effect of the acoustic wave device in the present disclosure.

Next, FIG. 4B shows the impedance characteristic when capacitances are added in series to the parallel resonators by a solid line, shows the characteristic when no capacitances are added by a broken line, and shows the resonator characteristic when capacitances are added in parallel by a dotted line. As clear also from FIG. 4B, by adding the capacitances, the resonance frequency shifts to a high frequency side. Further, it could be confirmed that, when capacitances are added in parallel, a resistance at the anti-resonance frequency (anti-resonance resistance Za) is degraded, but it was not degraded when adding the capacitances in series. Note that, the amount of shift of the resonance frequency is determined by the magnitude of the capacitance.

Figure 4C:
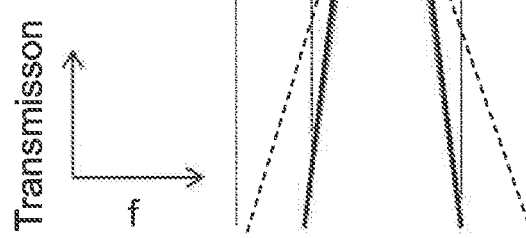
FIG. 4C is an explanatory view for verifying the effect of the acoustic wave device in the present disclosure.

Further, FIG. 4C shows the filter characteristic when the serial resonators and parallel resonators are connected in a ladder configuration. In FIG. 4C, the characteristic where capacitances are added in parallel to the serial resonators and the capacitances are added in series to the parallel resonators is indicated by a solid line, the characteristic where no capacitances are added to either the serial resonators or parallel resonators is indicated by a broken line, and the characteristic where capacitances are added in parallel to both of the serial resonators and the parallel resonators is indicated by a dotted line.

As clear also from this diagram, by adding the capacitances parallel to the serial resonators in the filter, a filter characteristic having a high steepness on the high frequency side of the pass-band is obtained. By adding the capacitances in series to the parallel resonators in the filter, a filter characteristic having a high steepness on the low frequency side of the pass band is obtained. Further, the loss characteristic of the passband is determined by Z0 of the serial resonator and Za of the parallel resonator. Therefore, by adding capacitances parallel to the serial resonators in the filter and adding capacitances in series to the parallel resonators, a filter characteristic having a low loss is obtained. That is, by adding capacitances as in the present embodiment, the steepness of the filter can be raised, further, by changing the connection method of the capacitances between the serial resonators and the parallel resonators, the loss of the filter can be reduced.

Note that, when the capacitances are added in series to the serial resonators, as can be deduced from FIG. 4B, a filter characteristic having a high steepness on the high frequency side of the pass band can be obtained, but the loss in the passband of the filter increases compared with the acoustic wave device in the present disclosure.

From the above description, by providing the first capacitance parts C1 and second capacitance parts C2 as in the present embodiment, the filter characteristics of the acoustic wave device 1 can be improved.

Further, in the present embodiment, provision is made of the second serial resonator Sy to which no first capacitance part C1 is connected. Due to this, since it is not provided with a first capacitance part C1 which degrades Za, the second serial resonator Sy becomes more excellent in its Za characteristic than a first serial resonator Sx. Further, the anti-resonance frequency moves to a higher frequency side than that at the time when a first capacitance part C1 is connected. For this reason, a filter characteristic improved also in the amount of attenuation on a higher frequency side than the passband can be obtained. At what degree of frequency position separated from the passband to improve the attenuation quantity depends upon the difference between $\Delta f$ of the first serial resonators Sx (difference between the resonance frequency and the anti-resonance frequency) and $\Delta f$ of the second serial resonator Sy. That is, it is substantially several tens of MHz although it depends upon the magnitude etc. of the first capacitance parts C1.

Further, provision is made of the second parallel resonator Py to which no second capacitance part C2 is connected. Due to this, since it is not provided with a second capacitance part C2 degrading Z0, the second parallel resonator Py becomes more excellent in its Z0 characteristic than a first parallel resonator Px. Further, the resonance frequency moves to a lower frequency side than that at the time when a second capacitance part C2 is connected. For this reason, a filter characteristic improved also in the amount of attenuation on a lower frequency side than the passband can be obtained. At what degree of frequency position separated from the passband to improve the attenuation quantity is the same as the case of the first capacitance parts and serial resonators S, and is substantially several tens of MHz.

Further, by providing both of such a second serial resonator Sy and second parallel resonator Py together, there can be provided a filter excellent in characteristics which can improve both of the attenuations on the high frequency side and low frequency side close to the passband and the band separated from the passband by several tens of MHz.

Further, in the present embodiment, the serial resonator which is nearest the output terminal O side among the plurality of serial resonators S1 to S4 is defined as the second serial resonator Sy, and the parallel resonator which is nearest the output terminal O side among the plurality of parallel resonators P1 to P4 is defined as the second parallel resonator Py. By such a configuration, when the output terminal O is connected to the antenna, it becomes possible to raise the filter characteristics while matching impedance with the antenna.

Note that, in the present embodiment, a second capacitance part C2 is connected between the serial arm 20s and the parallel resonator in the parallel arm 20p. However, there is no problem even if it is connected between the parallel resonator and the reference potential part Gnd in the parallel arm 20p. A second capacitance part C2 is smaller in size than a parallel resonator in many cases. Therefore, from the viewpoint of reduction of sizing, preferably it is arranged on the serial arm 20p side as in the present embodiment.

Further, the capacitances of the capacitance parts C1a to C1c may be the same or may be made different from each other. This is true also for the capacitance parts C2a to C2c.

Other Embodiment 1

In the example shown in FIG. 1, the individual resonance frequencies of the parallel resonators P1 to P4 are not particularly limited. They may be the same or may be made different from each other. If making them different from each other, the resonance frequencies of the first parallel resonators Px may be made higher compared with the resonance frequency of the second parallel resonator Py. In other words, among the plurality of parallel resonators P1 to P4, the second capacitance parts C2 may be connected to resonators having a high resonance frequency.

In this case, the first parallel resonators Px and the second capacitance parts C2 can be used to improve the attenuation characteristic in the vicinity of the low frequency side of the passband. Further, due to the second parallel resonator Py, the deterioration of the anti-resonance frequency Za is reduced, and the attenuation characteristic of the frequency band separated a bit on the low frequency side of the passband can be improved. Further, by providing such first parallel resonators Px and second parallel resonator Py, it is possible to provide an acoustic wave device 1 excellent in attenuation characteristic in a broad range on the low frequency side of the passband.

Note that, the difference of resonance frequency between the first parallel resonators Px and the second parallel resonator Py changes according to the design and target characteristics. However, the upper limit is $\Delta f$ (difference between the resonance frequency and the anti-resonance frequency). When use is made of a 36° to 50° Y-cut LT wafer, it is 20 to 40 MHz.

Other Embodiment 2

In the example shown in FIG. 1, no particular reference is made to the comparison of magnitudes of capacitances between the first capacitance parts C1 and the second capacitance parts C2. They may be the same or may be made different from each other. However, if making them different from each other, the capacitances may be made larger in the second capacitance parts C2 than that in the first capacitance parts C1.

In order to improve the steepness on the high frequency side out of the passband, it is necessary to make $\Delta f$ of the serial resonators S small and it is necessary to make the capacitance of the first capacitance parts C1 large. However, the amount of attenuation is determined also by the capacitance ratio between the serial resonators S and the parallel resonators P, therefore the combined capacitance of the first capacitance parts C1 and the first serial resonators Sx must be made almost equal to that before connection of the first capacitance parts C1. The first capacitance parts C1 and the first serial resonators Sx are connected in parallel. Therefore, in order to make the capacitances almost equal, preferably the capacitances of the first capacitance parts C1 are designed small.

In the same way, in order to improve the steepness on the low frequency side out of the passband, it is necessary to make $\Delta f$ of the parallel resonators small and it is necessary to make the capacitances of the second capacitance parts C2 small. However, the amount of attenuation is determined also by the capacitance ratio between the serial resonators and the parallel resonators, therefore the combined capacitance of the second capacitance parts C2 and the first parallel resonators Px must be made almost equal to that before connection of the second capacitance parts C2. The second capacitance parts C2 and the first parallel resonators Px are connected in series. Therefore, in order to make the capacitances almost equal, preferably second capacitance parts C2 are designed large. For this reason, by making the capacitances of the second capacitance parts C2 larger compared with the first capacitance parts C1, the attenuation characteristic can be improved on both of the high frequency side and low frequency side out of the passband.

Specifically, the capacitances of the first capacitance parts C1 may be set to about 0.1 to 5 pF, and the capacitances of the second capacitance parts C2 may be set to about 1 to 10 pF.

Other Embodiment 3

In the example shown in FIG. 1, the configurations of the first capacitance parts C1 and second capacitance parts C2 are not limited. They may be a stacked type sandwiching a dielectric film between a pair of electrodes, or may have a pair of electrodes facing each other on the major surfaces of the piezoelectric substrate 2. However, as shown in FIG. 5, they may be configured by a pair of comb-shaped electrodes 60 (first comb-shaped electrode 60a and second comb-shaped electrode 60b) provided with pluralities of electrode fingers 62 (first electrode fingers 62a and second electrode fingers 62b). The first electrode fingers 62a are commonly connected to a bus bar 61 (first bus bar 61a), and the second electrode fingers 62b are commonly connected to a bus bar 61 (a second bus bar 61b).

By configuring the device in this way, a large capacitance can be formed with a small area, therefore the acoustic wave device 1 can be reduced in size. In particular, the pitch of the electrode fingers 62 (electrode cycle) may be made smaller compared with the pitch of the electrode fingers 32 in the serial resonators S1 to S4 and parallel resonators P1 to P4 or the duty may be made larger with making the crossing width of the electrode fingers 62 small. By employing such a configuration, the area of the region required for obtaining the desired capacitances for the first and second capacitance parts C1 and C2 can be made smaller. As a result, the acoustic wave device 1 can be reduced in size.

Note that, the direction in which the pluralities of electrode fingers 62 (first electrode fingers 62a and second electrode fingers 62b) are repeatedly arranged may be made substantially the same as (substantially parallel to) the direction of propagation of the SAW (X-axis of the piezoelectric substrate 2). In that case, the resonance characteristics of the first and second capacitance parts C1 and C2 can be used for the adjustment of the filter characteristics. Here, "the direction (D1) in which the pluralities of electrode fingers 62 are repeatedly arranged is 'substantially the same' as the direction of propagation of the SAW (X-axis of the piezoelectric substrate 2)" is not limited to the case where the angle formed by D1 and X-axis is 0° and includes also a case where the direction is inclined a little. Specifically, it includes 15° or less as well.

For example, the electrode fingers may be designed so that the resonance frequency generated according to the array of the first electrode fingers 62a and second electrode fingers 62b becomes out of the passband of the filter in the acoustic wave device 1. By setting the resonance frequencies of the first capacitance part C1 and second capacitance part C2 out of the passband in this way, the passage characteristics of the filter can be controlled to those as designed. Further, when there is a frequency band in which attenuation must be carried out outside of the passband, an attenuation pole can be formed by the resonance characteristics of the capacitance parts C1 and C2 as well.

In particular, when provision is made of the first serial resonators Sx and second serial resonator Sy and/or first parallel resonators Px and second parallel resonator Py, the attenuation characteristics in the vicinity of the passband can be raised by these resonators, and the attenuation characteristic in the frequency band apart from the passband can be raised by the capacitance parts C1 and C2. For example, if the resonance frequencies of the capacitance parts C1 and C2 are controlled to become about 2 times of the resonance frequency of the serial resonators S or parallel resonators P, the attenuation characteristic in the 2f band can be raised.

Further, the resonance frequencies of the first and second capacitance parts C1 and C2 may be set to position on high frequency side out of the passband by making the pitch of the electrode fingers 62 (electrode period) smaller compared with the pitch of the electrode fingers 32 in the serial resonators S1 to S4 and parallel resonators P1 to P4. In this case, the attenuation characteristic on the high frequency side out of the passband of the filter can be improved while suppressing the influence which will be exerted upon the passage characteristic of the filter.

Further, in the case where the resonance frequency of the first capacitance parts C1 and the anti-resonance frequency of the second capacitance parts C2 are made to substantially match by making the pitch of the electrode fingers 62 in the first capacitance part C1 smaller compared with the pitch of the electrode fingers 62 in the second capacitance parts C2, a bandstop filter can be configured by the resonance and anti-resonance characteristics generated in the capacitance parts C1 and C2. As a result, passage of the signal is prevented by this bandstop filter, therefore the attenuation characteristic in the stop band of the passband can be improved.

Note that, in this case, in both of the capacitance parts C1 and C2, the pitch of the electrode fingers 62 may be made smaller or larger compared with the pitch of the electrode fingers 32 in the serial resonators S1 to S4 and parallel resonators P1 to P4, and the resonance frequency and the anti-resonance frequency may be positioned on the same side outside of the passband of the filter.

Note that, when the direction in which the plurality of electrode fingers 62 (first electrode fingers 62a and second electrode fingers 62b) are repeatedly arranged is different from the direction of propagation of the SAW (X-axis of the piezoelectric substrate 2), vibration by the first and second capacitance parts C1 and C2 can be suppressed. As a result, even if the electrode fingers 62 are arranged with a narrow pitch, short-circuiting between the first electrode fingers 62a and the second electrode fingers 62b due to migration or the like can be suppressed, therefore an acoustic wave device 1 having a high reliability can be provided.

Other Embodiments

The present disclosure is not limited to the embodiments explained above and can be changed in various ways. For example, in the embodiments explained above, the explanation was given by taking as an example the case where use is made of a surface acoustic wave (SAW) device as the acoustic wave device 1, but an elastic boundary wave device may be used or film bulk acoustic resonator (FBAR) may be used as well.

Part of the serial resonators S1 to S4 and parallel resonators P1 to P4 may be configured as divided resonators as well. In that case, if first capacitance parts C1 are provided in parallel for the individual divided resonators, the optimum capacitance values can be given to the individual resonators, therefore this is preferred.

Further, in the embodiments explained above, the explanation was given by taking as an example the case where there are plurality of first capacitance parts C1 and plurality of second capacitance parts C2. However, the number of each may be one as well. Further, where two or more exist, the capacitances may be individually different as well.

Further, a composite substrate may be formed as well in which the piezoelectric substrate 2 is formed into a thin layer, and an Si substrate or sapphire substrate, crystal, or other material having a small linear expansion coefficient is adhered to the other major surface. In that case, a change in characteristics due to a change in temperature can be suppressed. In the same way, a configuration burying the IDT electrode 3 by a thick film of $SiO_2$ or the like may be employed as well. In this case, a change in characteristics due to a change in temperature can be suppressed.

Further, the embodiments explained above can be combined with each other.

Further, the input part I and the output part O just show the ports to and from which signals are input and output. Signals may be input to the output part O, and signals may be output from the input part I as well.

<Communication Apparatus>

Figure 6:
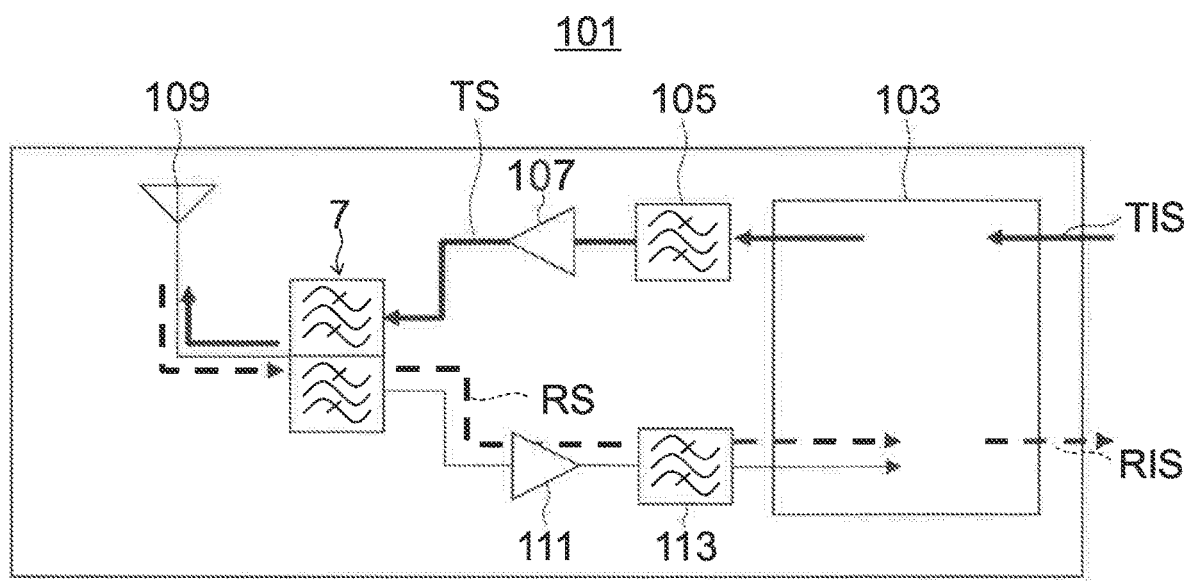
FIG. 6 A schematic view for explaining a communication apparatus according to an embodiment of the present disclosure.

FIG. 6 is a block diagram showing the principal part in a communication apparatus 101 according to an embodiment of the present disclosure. The communication apparatus 101 performs wireless communications utilizing radio waves. A multiplexer 7 has a function of branching a signal having a transmission frequency and a signal having a reception frequency in the communication apparatus 101.

In the communication apparatus 101, a transmitting information signal (TIS) including information to be transmitted is modulated and boosted in frequency (converted to a high frequency signal in carrier wave frequency) by an RF-IC (radio frequency-integrated circuit) 103 to form a transmitting signal (TS). TS is stripped of unnecessary components other than the transmission-use passband by a band pass filter 105, is amplified by an amplifier 107, and is input to the multiplexer 7. The multiplexer 7 strips unnecessary components other than the transmission-use passband from the input TS and outputs the result to an antenna 109. The antenna 109 converts the input electrical signal (TS) to a wireless signal and transmits the result.

In the communication apparatus 101, the wireless signal received by the antenna 109 is converted to an electrical signal (receiving signal, RS) by the antenna 109 and is input to the multiplexer 7. The multiplexer 7 strips unnecessary components other than the reception-use passband from the input RS and outputs the result to an amplifier 111. The output RS is amplified by the amplifier 111 and is stripped of unnecessary components other than the reception-use passband by a band pass filter 113. Further, the RS is boosted down in frequency and demodulated by the RF-IC 103 to become a receiving information signal (RIS).

TIS and RIS may be low frequency signals (baseband signals) containing suitable information. For example, they are analog audio signals or digital audio signals. The passband of the wireless signal may be one according to various standards such as the UMTS (Universal Mobile Telecommunications System). The modulation scheme may be either of phase modulation, amplitude modulation, frequency modulation, or a combination of any two or more among them.

<Multiplexer>

Figure 7:
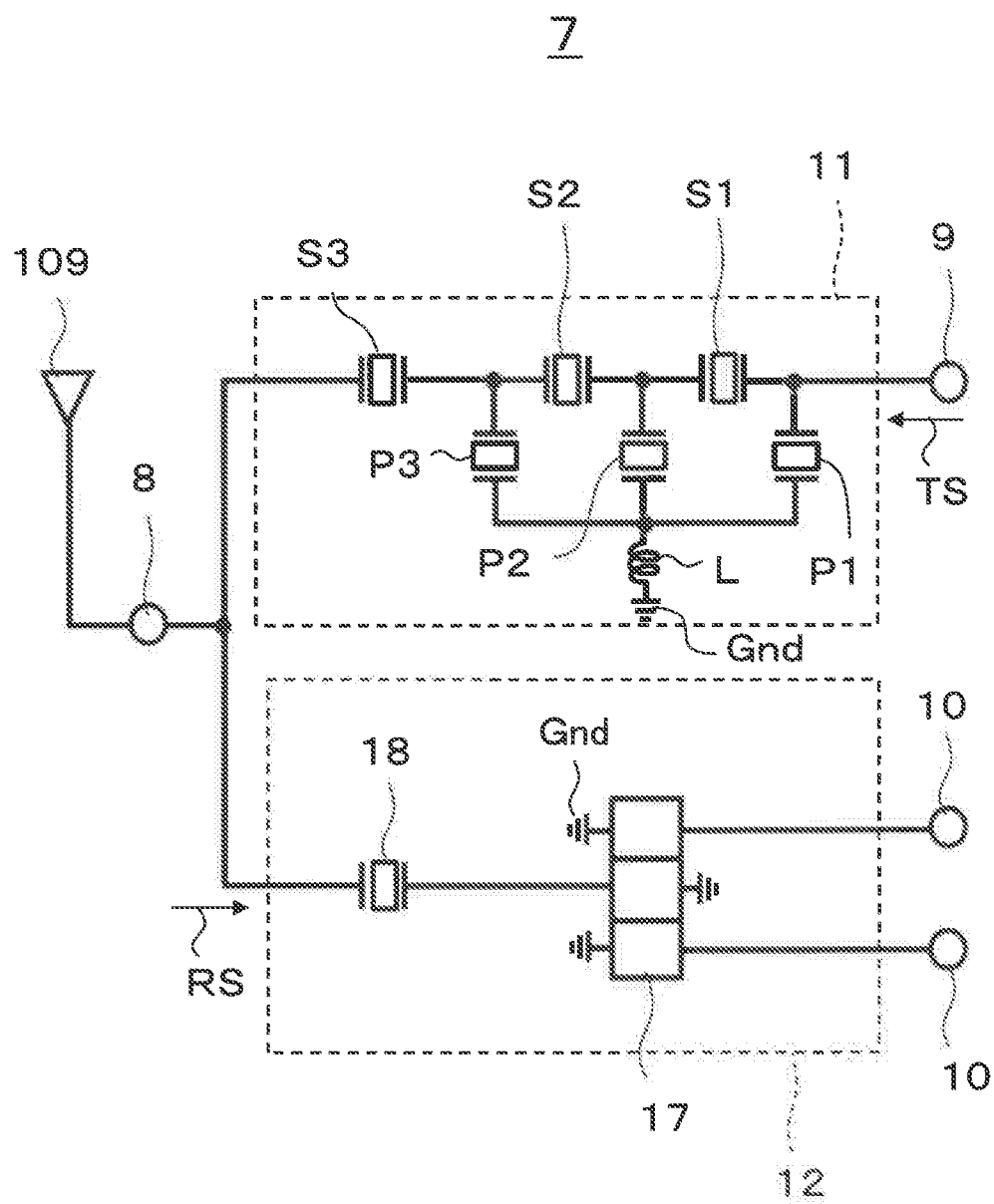
FIG. 7 A circuit diagram for explaining a multiplexer using an acoustic wave device according to an embodiment of the present disclosure.

FIG. 7 is a circuit diagram showing the configuration of the multiplexer 7 using the acoustic wave device 1 according to an embodiment of the present disclosure. The multiplexer 7 is a multiplexer used in the communication apparatus 101 in FIG. 6. The multiplexer 7 has an acoustic wave device configuring a transmission filter 11 and/or receiving filter 12. The acoustic wave device configuring the transmission filter 11 and/or receiving filter 12 is configured by resonators arranged on the piezoelectric substrate 2.

The acoustic wave device 1 is for example a transmission filter 11 in the multiplexer 7 shown in FIG. 7. A ladder-type filter circuit is configured by a plurality of SAW resonators in the transmission filter 11. The transmission filter 11, as shown in FIG. 7, has a piezoelectric substrate 2 (not shown) and serial resonators S1 to S3 and parallel resonators P1 to P3 which are formed on the piezoelectric substrate 2. Note that, the description of the first capacitance parts C1 and second capacitance parts C2 is omitted. However, for example, the capacitance parts C1 and C2 are provided in the serial resonator S1 and parallel resonator P1 on the side near a transmission terminal 9.

The multiplexer 7 is mainly configured by an antenna terminal 8, transmission terminal 9, reception terminals 10, the transmission filter 11 arranged between the antenna terminal 8 and the transmission terminal 9, and the receiving filter 12 arranged between the antenna terminal 8 and the reception terminals 10.

Where use is made of the acoustic wave element 1 for the transmission filter 11, the input part I of the acoustic wave element 1 is electrically connected to the transmission terminal 9, and the output part O is electrically connected to the antenna terminal 8.

The TS from the amplifier 107 is input to the transmission terminal 9. The TS input to the transmission terminal 9 is stripped of unnecessary components other than the transmission-use passband in the transmission filter 11 and is output to the antenna terminal 8. Further, the RS is input to the antenna terminal 8 from the antenna 109, the unnecessary components other than the reception-use passband are stripped in the receiving filter 12, and the result is output to the reception terminals 10.

The transmission filter 11, in this example, is configured by a ladder-type SAW filter. Specifically, the transmission filter 11 has three serial resonators S1 to S3 which are connected in series between its input side and output side and three parallel resonators P1 to P3 which are provided between the serial arm which is the line connecting the serial resonators to each other and the reference potential part Gnd. That is, the transmission filter 11 is the ladder-type filter having a three-stage configuration. Note, in the transmission filter 11, there may be any number of stages of the ladder-type filter.

Between the parallel resonators P1 to P3 and the reference potential part Gnd, an inductor L is provided. By setting the inductance of this inductor L to the predetermined magnitude, an attenuation pole is formed out of the band of the passing frequency of the transmission signal thereby making the attenuation out of the band large. Each of the plurality of serial resonators S1, S2, and S3 and plurality of parallel resonators P1, P2, and P3 is configured by a SAW resonator.

The receiving filter 12 for example has a multiplex mode type SAW filter 17 and an auxiliary resonator 18 which is connected in series to the input side of the former. Note that, in the present embodiment, the multiplex mode includes a double mode. The multiplex mode type SAW filter 17 has a balance-unbalance conversion function, and the receiving filter 12 is connected to the two reception terminals 10 from which balanced signals are output. The receiving filter 12 is not limited to one configured by the multiplex mode type SAW filter 17 and may be configured by the ladder-type filter or may be a filter not having a balance-unbalance conversion function.

Between the connection point of the transmission filter 11, receiving filter 12, and the antenna terminal 8 and the ground potential part G, a circuit for impedance matching which is configured by an inductor or the like may be inserted as well.

In this way, according to the communication apparatus 101 using the acoustic wave device 1 in the multiplexer 7, the attenuation characteristics out of the passband are excellent, and the loss of the passband is small, therefore the isolation characteristic between TS and RS is excellent and the loss becomes small, so high speech quality can be realized. Further, even in a case where the passbands of the receiving filter 12 and the transmission filter 11 are close to each other, by using the acoustic wave device 1 excellent in attenuation characteristics out of the passband, the communication apparatus 101 excellent in isolation characteristic can be provided.

There is a case where the passband of the transmission filter 11 is positioned on a high frequency side compared with the passband of the receiving filter 12. Here, in the acoustic wave device 1, by connecting the second capacitance parts C2 in series to the parallel resonators P, the attenuation characteristic on the low frequency side of the passband is made good. For this reason, by using the acoustic wave device 1 in the transmission filter 11, the isolation characteristic from the receiving filter 12 positioned on the low frequency side can be improved.

Further, use of the present acoustic wave device 1 is preferred in a case where there is another communication band on the low frequency side of the transmission filter 11.

EXAMPLES

In order to confirm the effects of the acoustic wave device 1 in the present embodiment, a model of the acoustic wave device 1 was set and a simulation was run to evaluate it. The fundamental configuration of the SAW element of the model is as follows.

[Piezoelectric Substrate 2]
Material: 46° Y-cut X-propagated LiTaO$_3$ substrate
[IDT Electrode 3]
Material: Al—Cu alloy
(However, there is underlying layer made of 6 nm of Ti between the piezoelectric substrate 2 and the conductive layer 15.)
  Thickness (Al—Cu alloy layer): 460 nm
  Electrode fingers 32 in IDT electrode 3:
  (Duty: w1/Pt1) 0.5
  (Crossing width W) 10 to 30λ (λ=2×Pt1)
  (Number of electrodes) 120 to 200
  (Electrode pitch) 2.4 to 2.6 µm
[Reflector 4]
Material: Al—Cu alloy
(However, there is underlying layer made of 6 nm of Ti between the piezoelectric substrate 2 and the conductive layer 15.)
  Thickness (Al—Cu alloy layer): 460 nm
  Number of reflection electrode fingers 42: 20
  Pitch Pt2 of reflection electrode fingers 42: 2.4 to 2.6 µm
[Protective Layer 5]
Material: SiO$_2$
Thickness: 15 nm By using a SAW element having such a fundamental configuration, as Example 1, an acoustic wave device shown in FIG. 8A in which four serial resonators S1 to S4 and four parallel resonators P1 to P4 were connected in a ladder configuration was formed. Note that, the serial resonator S1 was divided into two to form serial divided resonators. The capacitances and configurations of the first capacitance parts C1 and second capacitance parts C2 were set as in the following description.

[Fundamental Configurations of C1 and C2]
Material: Al—Cu alloy
(However, there is underlying layer made of 6 nm of Ti between the piezoelectric substrate 2 and the conductive layer 15.)
  Thickness (Al—Cu alloy layer): 460 nm
  Electrode fingers 62:
  (Duty: w1/Pt1) 0.6
  (Crossing width W) 10 to 30λ
  (Number of electrodes) 50 to 200
  (Electrode pitch) 1.4 to 1.6 µm
  Designed capacitances: C1 about 1 to 2 pF
  C2 about 2 to 4 pF Contrary to this, as Comparative Example 1, an element as shown in FIG. 8B connecting capacitances parallel to both of the parallel resonators P1 and P2 was prepared. The magnitude of the capacitance was set so as to optimize the filter characteristic of each.

Figure 9A:
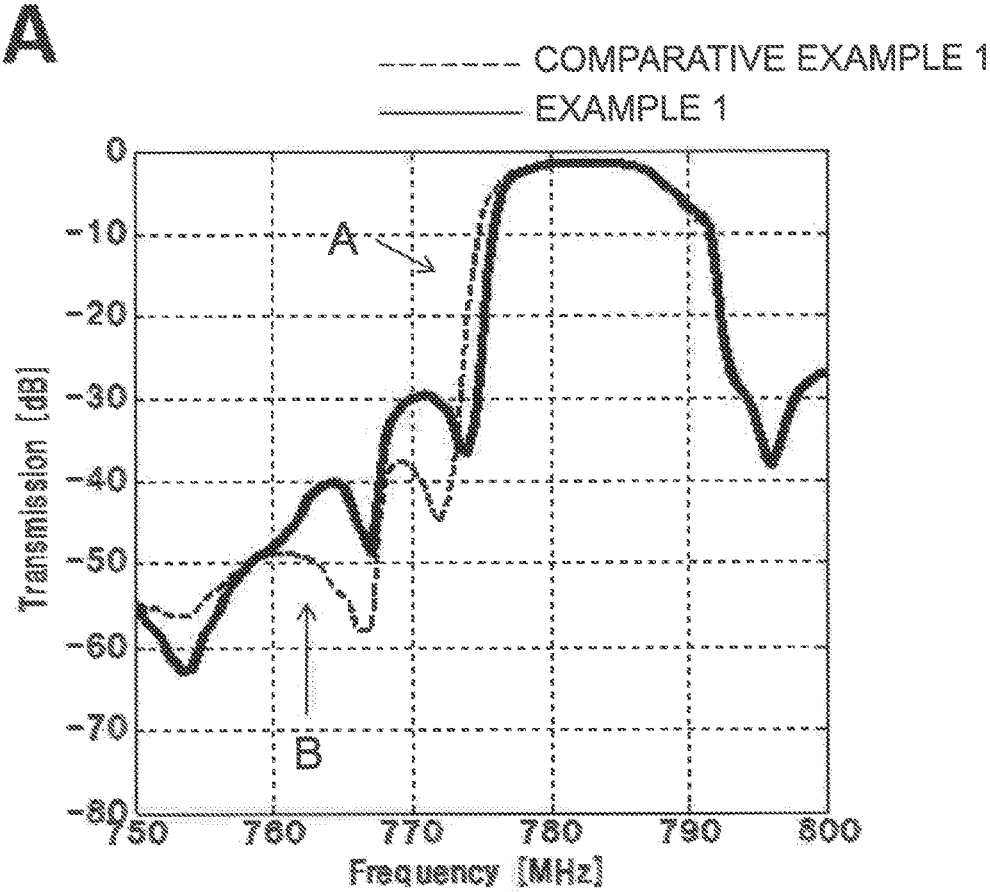
FIG. 9A is a graph showing results of simulation of filter characteristics of acoustic wave devices according to an example and comparative example.
Figure 9B:
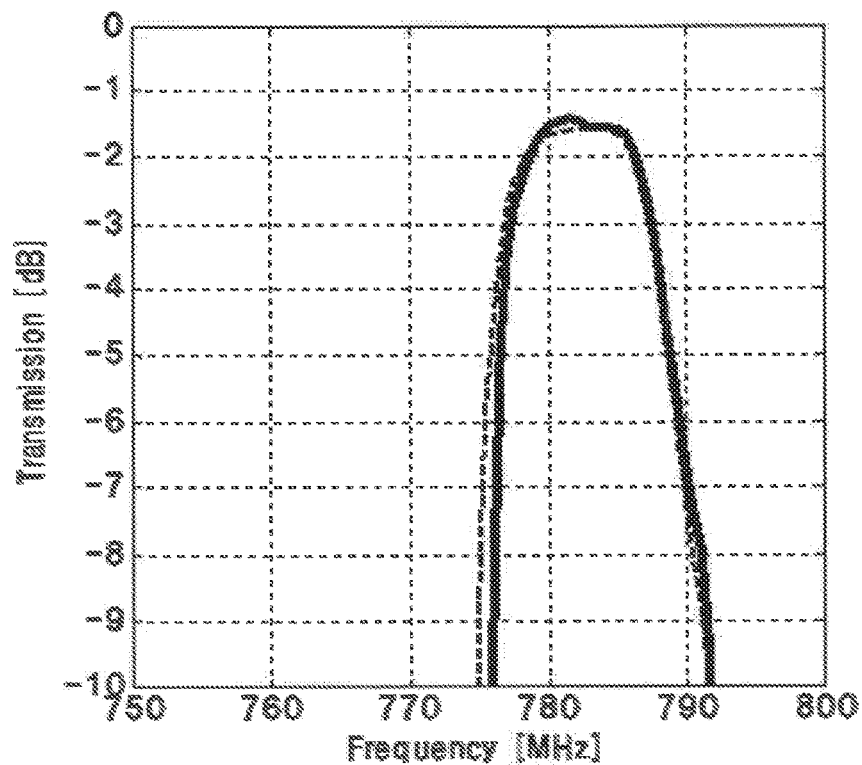
FIG. 9B is an enlarged view of the principal part in FIG. 9A.

The filter characteristics of the acoustic wave device in Example 1 and the acoustic wave device in Comparative Example 1 are shown in FIGS. 9A and 9B. In FIGS. 9A and 9B, the abscissas show frequencies, and the ordinates show amounts of attenuation. The characteristics of the acoustic wave device according to Comparative Example 1 are indicated by broken lines, and the characteristics of the acoustic wave device according to Example 1 are indicated by solid lines. FIG. 9B is an enlarged diagram of the principal part in FIG. 9A.

As apparent also from these graphs, by adding capacitances in parallel to the serial resonators and adding capacitances in series to the parallel resonators, it could be confirmed that the amount of attenuation could be increased in the low frequency side region outside of the passband. In particular, as indicated by an arrow A, it could be confirmed that the steepness was raised and the attenuation characteristic was excellent even in a region away from the passband as indicated by an arrow B.

Further, compared with Comparative Example 1, in Example 1, it could be confirmed that the loss of the passband became small.

Next, as Example 2 and Comparative Example 2, models of acoustic wave device having narrow bandwidths compared with those in Example 1 and Comparative Example 1 were set and simulations were run for evaluation. The fundamental configurations of the SAW elements as the models and the fundamental configurations of the capacitance parts C1 and C2 are the same as those in Example 1.

Figure 8A:
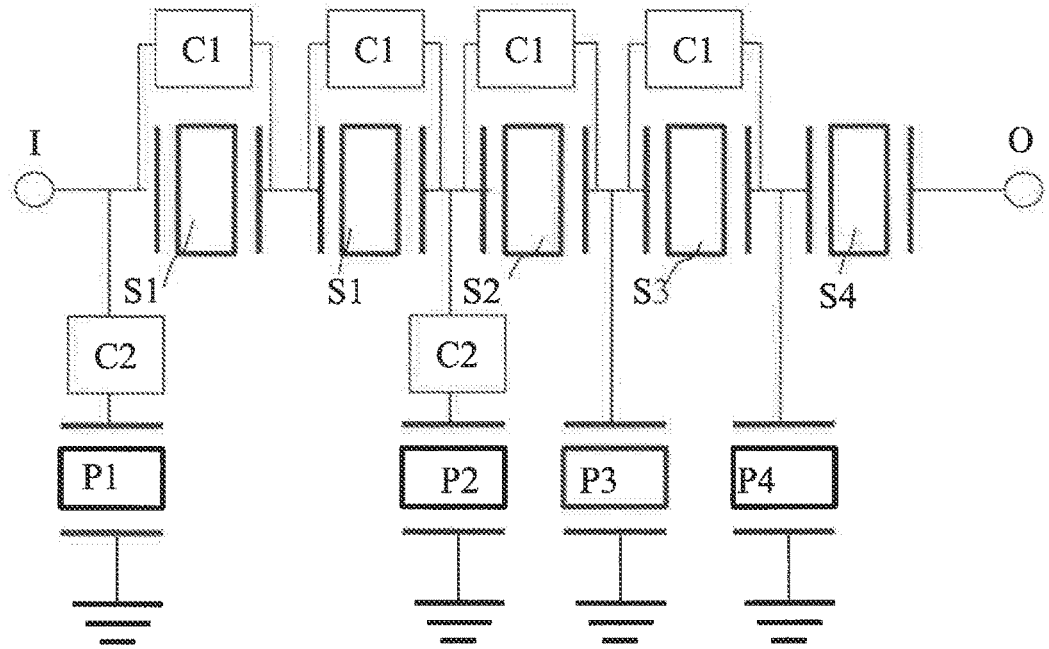
FIG. 8A is a circuit diagram of an acoustic wave device in Example 1.
Figure 8B:
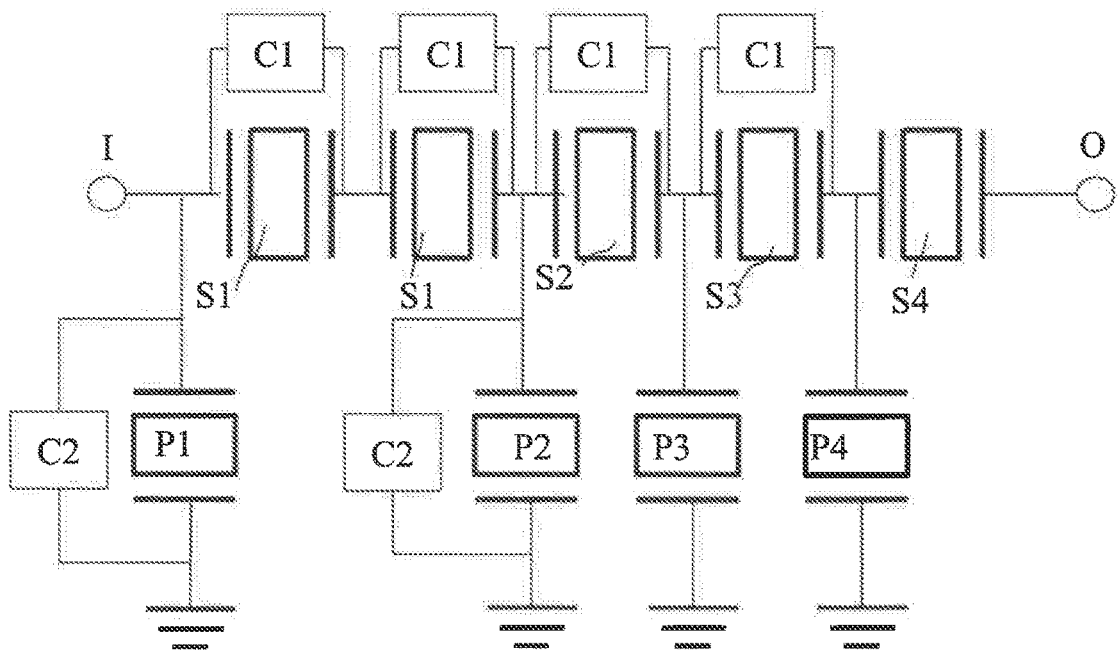
FIG. 8B is a circuit diagram of an acoustic wave device in Comparative Example 1.
Figure 10:
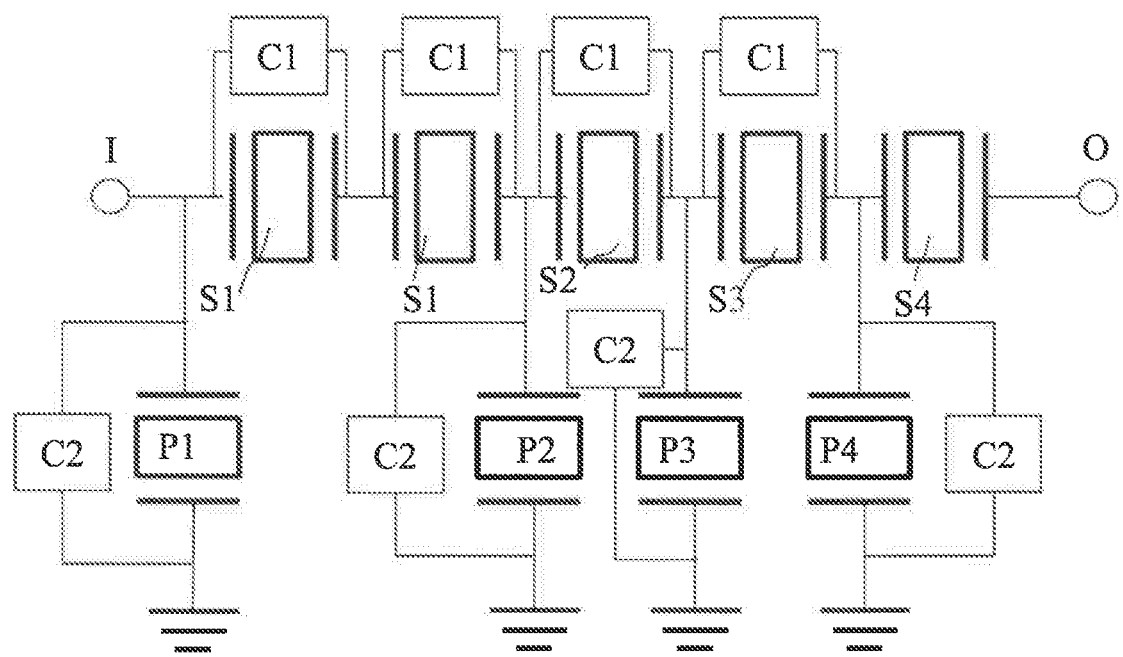
FIG. 10 A circuit diagram of an acoustic wave device in Comparative Example 2.

The circuit diagram of the acoustic wave device in Example 2 is the same as the configuration shown in FIG. 8A, but the magnitudes of the capacitances were made different from those in Example 1. FIG. 10 shows the circuit diagram of the acoustic wave device in Comparative Example 2. As shown in FIG. 10, in both of Example 2 and Comparative Example 2, provision is made of serial resonators S1 to S4 and parallel resonators P1 to P4. No capacitance is connected to the serial resonator S4. In Comparative Example 2, capacitances are connected in parallel to the parallel resonators P1 to P4.

Note that, the number of parallel resonators P to which capacitances are connected is different between Example 2 and Comparative Example 2. This is because these were set so as to optimize the filter characteristic of each in a state where a desired band width is obtained.

Figure 11:
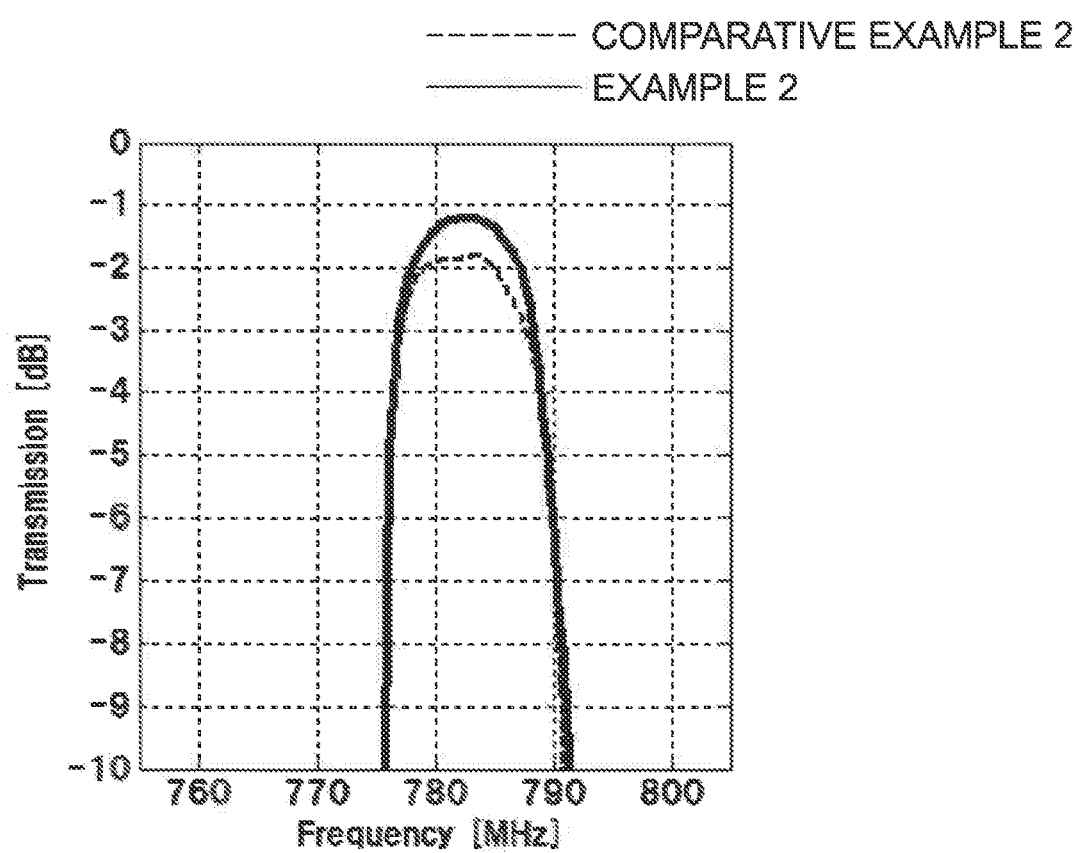
FIG. 11 A graph showing results of simulation of filter characteristics of acoustic wave devices according to an example and comparative example.

FIG. 11 shows the filter characteristics of the acoustic wave device in Example 2 and the acoustic wave device in Comparative Example 2. In FIG. 11, the abscissa shows the frequencies, and the ordinate shows the attenuation quantities. The characteristic of the acoustic wave device according to Comparative Example 2 is indicated by the broken line, and the characteristic of the acoustic wave device according to Example 2 is indicated by the solid line.

As apparent also from FIG. 11, it was seen that the loss in the passband in Example 2 became small compared with Comparative Example 2. It could be confirmed from this fact that the loss could be improved according to the configuration of the present disclosure particularly when a filter having a narrow passband was realized.

REFERENCE SIGNS LIST

1 . . . acoustic wave device (SAW device), 101 . . . communication apparatus, 103 . . . RF-IC, 109 . . . antenna, S1 to S4 . . . serial resonators, Sx . . . first serial resonator, Sy . . . second serial resonator, P1 to P4 . . . parallel resonators, Px . . . first parallel resonator, Py . . . second parallel resonator, C1 . . . first capacitance part, and C2 . . . second capacitance part

The invention claimed is:

1. An acoustic wave device, comprising:
a plurality of serial resonators and a plurality of parallel resonators configured by acoustic wave elements, which plurality of serial resonators and plurality of parallel resonators configure a filter in which they are connected in a ladder configuration,
a first capacitance part which is connected in parallel to at least one of the plurality of serial resonators, and
a second capacitance part which is connected in series to at least one of the plurality of parallel resonators,
wherein the plurality of serial resonators comprise a first serial resonator to which the first capacitance part is connected in parallel and a second serial resonator to which no first capacitance part is connected,
the plurality of parallel resonators comprise a first parallel resonator to which the second capacitance part is connected in series and a second parallel resonator to which no second capacitance part is connected,
the plurality of serial resonators and the plurality of parallel resonators are connected in a ladder configuration between an antenna terminal and a transmission terminal,
the second serial resonator is on the side nearest the antenna terminal among the plurality of serial resonators, and
the second parallel resonator is on the side nearest the antenna terminal among the plurality of parallel resonators.

2. The acoustic wave device according to claim 1, wherein the first parallel resonator has a higher resonance frequency compared with the second parallel resonator.

3. The acoustic wave device according to claim 1, wherein the capacitance of the first capacitance part is smaller compared with the capacitance of the second capacitance part.

4. The acoustic wave device according to claim 1, wherein the first capacitance part and the second capacitance part are pairs of comb-shaped electrodes configured by pluralities of electrode fingers.

5. The acoustic wave device according to claim 4, wherein
directions of arrangement of the pluralities of electrode fingers in the first capacitance part and the second capacitance part are substantially parallel to the direction of propagation of acoustic waves of the plurality of serial resonators and the plurality of parallel resonators, and
resonance frequencies of the first capacitance part and the second capacitance part are out of the passband of the filter.

6. The acoustic wave device according to claim 5, wherein the resonance frequencies of the first capacitance part and the second capacitance part are higher than the passband of the filter.

7. The acoustic wave device according to claim 5, wherein the resonance frequency of the first capacitance part and the anti-resonance frequency of the second capacitance part are made to substantially match.

8. The acoustic wave device according to claim 4, wherein directions of arrangement of the pluralities of electrode fingers in the first capacitance part and the second capacitance part are different from the direction of propagation of acoustic waves of the plurality of serial resonators and the plurality of parallel resonators.

9. A communication apparatus comprising:
an antenna,
an acoustic wave device according to claim 1 electrically connected to the antenna, and
an RF-IC electrically connected to the acoustic wave device.

10. An acoustic wave device, comprising:
a plurality of serial resonators and a plurality of parallel resonators configured by acoustic wave elements, which plurality of serial resonators and plurality of parallel resonators configure a filter in which they are connected in a ladder configuration,
a first capacitance part which is connected in parallel to at least one of the plurality of serial resonators,
a second capacitance part which is connected in series to at least one of the plurality of parallel resonators,
wherein the first capacitance part and the second capacitance part are pairs of comb-shaped electrodes configured by pluralities of electrode fingers,
directions of arrangement of the pluralities of electrode fingers in the first capacitance part and the second capacitance part are substantially parallel to the direction of propagation of acoustic waves of the plurality of serial resonators and the plurality of parallel resonators,
resonance frequencies of the first capacitance part and the second capacitance part are out of the passband of the filter, and
the resonance frequency of the first capacitance part and the anti-resonance frequency of the second capacitance part are made to substantially match.

11. The acoustic wave device according to claim 10, wherein
the plurality of serial resonators comprise a first serial resonator to which the first capacitance part is connected in parallel and a second serial resonator to which no first capacitance part is connected, and the plurality of parallel resonators comprise a first parallel resonator to which the second capacitance part is connected in series and a second parallel resonator to which no second capacitance part is connected.

12. The acoustic wave device according to claim 11, wherein the first parallel resonator has a higher resonance frequency compared with the second parallel resonator.

13. The acoustic wave device according to claim 10, wherein the capacitance of the first capacitance part is smaller compared with the capacitance of the second capacitance part.

14. A communication apparatus comprising:
an antenna,
an acoustic wave device according to claim 10 electrically connected to the antenna, and
an RF-IC electrically connected to the acoustic wave device.

* * * * *